United States Patent
Mandl et al.

(10) Patent No.: US 9,691,815 B2
(45) Date of Patent: Jun. 27, 2017

(54) METHOD FOR PRODUCING AN OPTOELECTRONIC SEMICONDUCTOR COMPONENT, AND OPTOELECTRONIC SEMICONDUCTOR COMPONENT

(71) Applicant: OSRAM Opto Semiconductors GmbH, Regensburg (DE)

(72) Inventors: Martin Mandl, Lappersdorf (DE); Martin Strassburg, Donaustauf (DE); Christopher Koelper, Regensburg (DE); Alexander F. Pfeuffer, Regensburg (DE); Patrick Rode, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/434,760

(22) PCT Filed: Oct. 1, 2013

(86) PCT No.: PCT/EP2013/070449
§ 371 (c)(1),
(2) Date: Apr. 9, 2015

(87) PCT Pub. No.: WO2014/056762
PCT Pub. Date: Apr. 17, 2014

(65) Prior Publication Data
US 2015/0279903 A1    Oct. 1, 2015

(30) Foreign Application Priority Data
Oct. 9, 2012 (DE) .................. 10 2012 109 594

(51) Int. Cl.
*H01L 33/00* (2010.01)
*H01L 27/15* (2006.01)
(Continued)

(52) U.S. Cl.
CPC ........ *H01L 27/156* (2013.01); *H01L 33/0062* (2013.01); *H01L 33/0079* (2013.01);
(Continued)

(58) Field of Classification Search
CPC ..................... H01L 33/0062; H01L 33/0079
See application file for complete search history.

(56) References Cited

U.S. PATENT DOCUMENTS

2006/0131679 A1    6/2006  Hantschel et al.
2008/0036038 A1    2/2008  Hersee et al.
(Continued)

FOREIGN PATENT DOCUMENTS

DE    10 2010 012 711 A1  *  9/2011
DE       102010012711 A1      9/2011
(Continued)

OTHER PUBLICATIONS

Ky, J.: "Closer to Flexible LED Displays", <http://www.yalescientific.org/2010/05/closer-to-flexible-led-displays/>, May 12, 2011, pp. 1-3.
(Continued)

*Primary Examiner* — Phat X Cao
(74) *Attorney, Agent, or Firm* — McDermott Will & Emery LLP

(57) ABSTRACT

In at least one embodiment of the method, said method includes the following steps: A) producing radiation-active islands (4) having a semiconductor layer sequence (3) on a growth substrate (2), wherein the islands (4) each comprise at least one active zone (33) of the semiconductor layer sequence (3), and an average diameter of the islands (4), as viewed in a top view of the growth substrate, amounts to between 50 nm and 10 μm inclusive, B) producing a separating layer (5) on a side of the islands (4) facing the growth substrate (2), wherein the separating layer (5) sur-
(Continued)

rounds the islands (4) all around, as viewed in a top view of the growth substrate (2), C) attaching a carrier substrate (6) to a side of the islands (4) facing away from the growth substrate (2), and D) detaching the growth substrate (2) from the islands (4), wherein at least a part of the separating layer (5) is destroyed and/or at least temporarily softened during the detachment.

17 Claims, 12 Drawing Sheets

(51) Int. Cl.
*H01L 33/24* (2010.01)
*H01L 25/075* (2006.01)
*H01L 33/18* (2010.01)
*H01L 33/38* (2010.01)

(52) U.S. Cl.
CPC .......... *H01L 33/24* (2013.01); *H01L 25/0753* (2013.01); *H01L 33/18* (2013.01); *H01L 33/385* (2013.01); *H01L 2924/0002* (2013.01)

(56) References Cited

U.S. PATENT DOCUMENTS

| | | |
|---|---|---|
| 2010/0117997 A1 | 5/2010 | Haase |
| 2010/0327258 A1 | 12/2010 | Lee et al. |
| 2011/0095260 A1* | 4/2011 | Kim .................. H01L 27/156 257/13 |
| 2011/0151602 A1 | 6/2011 | Speier |
| 2011/0297913 A1 | 12/2011 | Kim et al. |
| 2011/0298001 A1 | 12/2011 | Akimoto et al. |

FOREIGN PATENT DOCUMENTS

| | | |
|---|---|---|
| DE | 102012101718 A1 | 9/2013 |
| WO | 2008/129859 A1 | 10/2008 |
| WO | 2010/059131 A1 | 5/2010 |
| WO | 2011/117056 A1 | 9/2011 |
| WO | 2011/123257 A1 | 10/2011 |
| WO | 2011/162715 A1 | 12/2011 |

OTHER PUBLICATIONS

Lee, S. et al.: "Water-resistant flexible GaN LED on a liquid crystal polymer substrate for implantable biomedical applications"; Elsevier, Nano Energy, vol. 1, 2012, pp. 145-151.

* cited by examiner

J)

K)

L)

M)

A)

B)

A)

B)

D)

E)

A)

B)

A)

B)

METHOD FOR PRODUCING AN OPTOELECTRONIC SEMICONDUCTOR COMPONENT, AND OPTOELECTRONIC SEMICONDUCTOR COMPONENT

SUMMARY

A method for producing an optoelectronic semiconductor component is provided. Furthermore, an optoelectronic semiconductor component produced thereby is provided.

An object to be achieved resides in the provision of an optoelectronic semiconductor component which has a high efficiency with large operating currents.

This object is achieved inter alia by a method and by an optoelectronic semiconductor component having the features of the independent claims. Preferred developments are described in the dependent claims.

According to at least one embodiment, the method is adapted for producing an optoelectronic semiconductor component. The semiconductor component is, for example, a light-emitting diode. In particular, the semiconductor component is configured for producing ultraviolet radiation, visible light and/or near-infrared radiation during operation.

According to at least one embodiment, the method includes the step of producing radiation-active islands. The islands have a semiconductor layer sequence. The semiconductor layer sequence is preferably based on a III-V-composite semiconductor material. The semiconductor material is, for example, a nitride composite semiconductor material such as $Al_nIn_{1-n-m}Ga_mN$ or a phosphide composite semiconductor material such as $Al_nIn_{1-n-m}Ga_mP$ or even an arsenic composite semiconductor material such as $Al_nIn_{1-n-m}Ga_mAs$, wherein in each case $0 \leq n \leq 1$, $0 \leq m \leq 1$ and $n+m \leq 1$. The semiconductor layer sequence can comprise dopants and additional constituents. However, for the sake of simplicity, only the essential constituents of the crystal lattice of the semiconductor layer sequence, i.e., Al, As, Ga, In, N or P are stated, even if these can be partially replaced by and/or supplemented with small amounts of other substances. Preferably, the semiconductor layer sequence is based on AlInGaN.

According to at least one embodiment, the islands are produced indirectly or directly on a growth substrate. The growth substrate is, for example, a sapphire substrate or a silicon substrate. The islands are formed, for example, by self-organised, three-dimensional growth, by selective growing on the growth substrate by means of a growth mask or by overgrowing of three-dimensional structures. Such three-dimensional structures can be produced from a two-dimensional layer for instance by means of etching.

According to at least one embodiment, the islands each comprise one or more active zones. The active zone is preferably a constituent of the semiconductor layer sequence and is located, for example, between a p-type layer and an n-type layer of the semiconductor layer sequence. The active zone can be a single, inherently coherent area of the semiconductor layer sequence having constant physical properties perpendicular to a major axis, within manufacturing tolerances. In the case of core-shell structures, the composition and/or a thickness of the active zones can gradually or suddenly change. Different crystal facets along core-shell structures can likewise result in differences in the design of the active zone. The thickness of the active zone in core-shell structures preferably amounts to at least 2 nm and/or at the most to 40 nm. In axial structures, the thickness of the active zone can even be up to 1000 nm. The active zone can be a single quantum well structure or a multiple quantum well structure.

According to at least one embodiment, an average diameter of the islands, as viewed in a top view of the growth substrate and after the islands have been produced, amounts to at least 50 nm or to at least 100 nm or to at least 200 nm. Alternatively or in addition, the average diameter amounts at the most to 10 μm or at the most to 5 μm or at the most to 3 μm or at the most to 2 μm. As viewed in a top view, the islands have, for example, a round or polygonal outline, in particular a hexagonal outline.

According to at least one embodiment, the method includes the step of producing a separating layer indirectly or directly on a side of the islands facing the growth substrate. The separating layer is configured for permitting the detachment of the islands from the growth substrate. The separating layer can, in the direction towards the growth substrate, terminate flush with the islands and extend as an extension of root points or growth points of the islands and/or a sacrificial layer of the islands.

According to at least one embodiment, the separating layer surrounds the islands or at least part of the islands all around, as viewed in a top view of the growth substrate. This is particularly the case after the separating layer has been produced and/or structured or after a partial material deposition of the separating layer after applying material of the separating layer. For example, the separating layer is then a contiguous layer in which a multiplicity of holes are formed, as viewed in a top view, wherein the islands are located in the holes of the separating layer and/or are grown out of the holes.

According to at least one embodiment, the method comprises the step of attaching a carrier substrate. Preferably, the carrier substrate is applied to a side of the islands facing away from the growth substrate. The carrier substrate can touch the islands or be spaced apart from the islands by at least one intermediate layer. It is possible for the carrier substrate to comprise electrical conductor paths or electrically conductive structures in order to provide the islands with current. The carrier substrate can be mechanically rigid carrier, for instance formed from a semiconductor material such as silicon or formed from a ceramic or a metal, or can even be a mechanically flexible carrier, for instance formed from a metal film or a plastic film.

According to at least one embodiment, the growth substrate is detached from the islands. Detaching occurs preferably by means of laser radiation and/or by etching and/or by the mechanical force effect.

According to at least one embodiment, the islands have a sacrificial layer on a side facing the growth substrate. The sacrificial layer is preferably a part of the semiconductor layer sequence of the islands. Furthermore, the sacrificial layer acts, for example, in an absorbing manner for a laser radiation which is used during the detachment of the growth substrate or the sacrificial layer is at least partially destroyed when detaching the growth substrate by etching or by the mechanical force effect. The sacrificial layer is, in particular, a part of the semiconductor layer sequence and/or of the islands which is located closest to the growth substrate. The sacrificial layer and the separating layer can be arranged in a common plane in parallel with the growth substrate.

According to at least one embodiment, the islands are partially or completely detached from the growth substrate by virtue of the fact that the separating layer and/or the sacrificial layer are at least partially destroyed by the laser radiation and/or that the laser radiation causes the separating layer and/or the sacrificial layer to be temporarily or permanently softened or liquefied and/or at least partially decomposed into the gas phase. In addition, it is possible for the separating layer and/or the sacrificial layer to be at least partially destroyed by the mechanical force effect.

According to at least one embodiment, the separating layer is used as an etching sacrificial layer for an etching process when detaching the growth substrate. In that case, the separating layer can consist of a material which can be etched selectively with respect to the surrounding layers. The islands can then be separated for example by means of mechanical loading of a buffer layer and/or of the growth substrate. For example, the separating layer comprises or consists of at least one of the following materials: Ag, ZnO, Al, Ti, Ni, $SiO_2$.

According to at least one embodiment, the islands are mechanically separated from the growth substrate. Owing to a low mechanical stability of the islands at the growth point, for example caused by a defective region, the islands break with a sufficient introduction of mechanical forces at the growth point, also referred to as root point. The mechanical force effect can occur, for example, by means of ultrasound or by means of shear forces, for instance caused by twisting the carrier substrate with respect to the growth substrate. In the case of mechanically flexible carrier substrates, a peeling process is also possible. Separation can be supported by the separating layer, which is adapted for low adhesion, or another process mentioned herein.

For separation of the growth substrate, bracing between the separating layer and the islands can also be utilised. Such bracing can be produced, for example, by introducing layers having different coefficients of thermal expansion and corresponding thermal stress.

Said processes for separation of the growth substrate can also be combined, for example a laser lift-off process applied to defective growth points of the islands can be followed by a selective etching process which removes the separating layer and thus exposes the growth substrate.

The sacrificial layer can act as a predetermined breaking point since defective material is present here which accordingly is more mechanically unstable and also can have a higher absorption compared with other layers of the islands.

In at least one embodiment, the method is adapted for producing an optoelectronic semiconductor component and includes at least the following steps:
A) producing radiation-active islands having a semiconductor layer sequence on a growth substrate, wherein the islands each have at least one active zone of the semiconductor layer sequence and an average diameter of the islands, as viewed in a plan view of the growth substrate, is between 50 nm and 10 µm inclusive,
B) producing one or several separating layers on a side of the islands facing the growth substrate, wherein the at least one separating layer surrounds the islands all around, as viewed in a top view of the growth substrate,
C) attaching a carrier substrate to a side of the islands facing away from the growth substrate, and
D) detaching the growth substrate from the islands, for instance by means of radiation, wherein, during the detachment, at least a part of the separating layer is destroyed and/or at least temporarily softened, for instance by the laser radiation.

Said method steps can be performed in the stated sequence or even in a different sequence. In a particularly preferred manner, step D) follows step C) in each case.

The efficiency of, for instance, GaN-based light-emitting diodes, LEDs for short, is limited under certain operating current conditions by the so-called droop effect. This effect refers to a significant drop in efficiency as the current density increases. One option of achieving higher efficiencies with a constant current density in an active zone, is the use of so-called core-shellnano-LEDs, or core-shellmicrorod-LEDs. In these LEDs, the radiation-active surface can be increased by a structured, three-dimensional growth with the semiconductor chip having a constant surface.

However, in such core-shellnano-LEDs, the chip processing, in particular the electrical contacting, is more complex. By means of a method described herein, the electrical contacting and also the mechanical stabilising of such components can be simplified. This can be achieved in particular by the process of separating the growth substrate, for instance by laser radiation using the separating layer. Flexible carrier materials can be used in view of the detaching of the growth substrate.

In the case of conventional, inorganic semiconductor components, a semiconductor layer sequence is achieved by a contiguous, thin, epitaxially produced layer sequence which has lateral dimensions, as viewed in a top view, in the range of several 100 µm to a few millimeters. In order to avoid problems such as cracks, the semiconductor layer sequence is to be mechanically stabilised. However, owing to the small lateral dimensions of the islands, there is no significant mechanical bracing in the provided semiconductor component within the islands during deflection, and cracks are prevented from forming which means that flexible carrier systems can be achieved.

Optoelectronic semiconductor components having a core-shell design are also disclosed in DE 10 2012 101 718 A1. The disclosure content of these documents is incorporated herein by reference.

According to at least one embodiment of the method, a buffer layer is produced on the growth substrate. The buffer layer can be attached directly to the growth substrate. For example, the buffer layer is based on GaN, AlGaN or AlN. It is possible for the buffer layer to have an increasing gallium proportion in the direction away from the growth substrate. A thickness of the buffer layer amounts, for example, to at least 10 nm or at least 50 nm and/or at the most to 10 µm or at the most to 500 nm. The buffer layer can be doped or undoped.

According to at least one embodiment, the buffer layer is produced as a two-dimensional layer. In other words, the buffer layer then extends as a continuous layer, which is unstructured, as viewed in a top view, without any intended openings over the growth substrate.

According to at least one embodiment, the separating layer is produced indirectly or directly on a side of the buffer layer facing away from the growth substrate. The buffer layer can thus touch the separating layer or can be spaced apart from the separating layer.

According to at least one embodiment, the buffer layer is completely removed at the latest in step D). After the step of removing the buffer layer and/or after the step of removing the growth substrate, adjacent islands are no longer connected together via a semiconductor material of the semiconductor layer sequence and/or of the buffer layer. In particular, there is no material connection between adjacent islands, wherein this material connection is based on the same material as the islands.

According to at least one embodiment, step A) follows step B). In that case, step A) precedes step C).

According to at least one embodiment, a masking layer is attached to the growth substrate and/or to the buffer layer. The masking layer has a multiplicity of openings. The islands are grown emanating from these openings or out of these openings. For example, the masking layer is formed from a silicon oxide or a silicon nitride or titanium or molybdenum. An average thickness of the masking layer preferably amounts at the most to 150 nm or at the most 50 nm or at the most 20 nm and/or to at least 0.5 nm or at least 2 nm.

According to at least one embodiment, the masking layer is formed by the separating layer. Alternatively thereto, it is possible for the separating layer and the masking layer to be formed from mutually different layers and from different materials.

According to at least one embodiment, the masking layer is formed from a radiation-absorbing material. For example, in that case, the masking layer is formed from silicon nitride, doped silicon oxide, titanium nitride, titanium oxide or tungsten nitride. Alternatively, multi-layer structures, for instance formed from a nitrogen-based or an oxygen-based dielectric and an absorbing metal or semiconductor, can also be used for the masking layer, e.g. $SiO_2/Ag$ or $SiO_2/Si$. According to at least one embodiment, the separating layer is formed as an etching sacrificial layer. In that case, the separating layer is formed, for example, from Ag or ZnO.

According to at least one embodiment, the separating layer is located directly on the growth substrate. Alternatively thereto, it is possible for the separating layer to be located directly on a side of the buffer layer facing away from the growth substrate. It is possible for the separating layer to touch the islands and/or the semiconductor layer sequence in places.

According to at least one embodiment, step B) follows step A) and step C) follows step B). In other words, the separating layer is then produced after the radiation-active islands have been produced.

According to at least one embodiment, the separating layer is, prior to step C), covered—as viewed in a top view of the growth substrate—in places or over the whole area by an electrical contact layer. The electrical contact layer is configured for supplying the islands with current. In particular, the electrical contact layer is a p-type contact to the islands which can be radiolucent.

According to at least one embodiment, the electrical contact layer touches the separating layer. For example, in that case, the electrical contact layer is applied directly to separating layer, in places or over the whole area.

According to at least one embodiment, the sacrificial layer of the islands is attached directly to the growth substrate or directly to the buffer layer. The sacrificial layer can be doped in a manner different from the other constituents of the semiconductor layer sequence. Preferably, the sacrificial layer is based on AlInGaN, AlGaN or GaN or even of another composite semiconductor such as ZnO, $Hf_2O$, HfN or ZrO. Likewise, the sacrificial layer can be formed from a metal such as Ni, Ti or W or from a metal alloy. A thickness of the sacrificial layer amounts for example to at least 15 nm and/or at the most to 100 nm or at the most to 500 nm.

According to at least one embodiment, the sacrificial layer is configured for being partially or completely decomposed and/or at least temporarily softened by the laser radiation in step D). In other words, in that case, in step D) separation occurs at the separating layer and at the sacrificial layer. The growth substrate can then be detached, over the whole area, from the islands and further material components which were applied to the growth substrate.

According to at least one embodiment, the active zone is applied to an n-type layer of the islands at least all around a peripheral surface, as viewed in a top view of the growth substrate. The n-type layer is, for example, column-shaped, prismatic, cylindrical, truncated cone-shaped or truncated pyramid-shaped. The active zone is preferably applied at least to lateral surfaces of the n-type layer. Likewise, it is possible for the active zone to also be applied to a side of the n-type layer facing away from the growth substrate. After application, the active zone can also be partially or completely removed on this side facing away from the growth substrate.

According to at least one embodiment, the active zone is oriented in the produced islands perpendicular or substantially perpendicular to the carrier substrate. In that case, each of the islands can comprise an active zone in the form of a cylindrical jacket.

According to at least one embodiment, the islands comprise, in the direction away from the growth substrate, a sequence of the n-type layer, the active zone and the p-type layer. In that case, the active zone is oriented substantially in parallel with the growth substrate and/or the carrier substrate. The active zone then preferably does not cover, or does not significantly cover, lateral surfaces of the n-type layer.

According to at least one embodiment, a quotient of an average height of the islands and of an average diameter of the islands amounts to at least one or to at least five or to at least eight. Alternatively or in addition, this quotient amounts at the most to 100 or at the most to 50 or at the most to 25. In other words, the islands are elongate, column-like shapes.

According to at least one embodiment, a region between adjacent islands is filled with a filling compound. Filling with the filling compound is preferably effected prior to step C) and after steps A) and B). The filling compound can be formed from a mechanically rigid material or from a mechanically flexible material.

According to at least one embodiment, the filling compound is electrically insulating. For example, the filling compound is formed by a silicon oxide, a silicon nitride, an aluminium oxide, aluminium nitride, a titanium oxide, a silicon oxynitride, tellurium oxide, a spin-on glass, benzocyclobutene, parylene, a silicone or a polymer.

The filling compound can completely fill the region between adjacent islands. The filling compound can be applied such that the islands are completely covered—as viewed in a top view of the growth substrate—at least temporarily by the filling compound.

According to at least one embodiment, the filling compound is formed from an optically active material or comprises one or more such materials. For example, the filling compound has at least one luminescent substance added thereto for converting a primary radiation produced by the islands into a second radiation different therefrom. Furthermore, owing to the filling compound, optical insulation of adjacent islands can be achieved. In this case, the filling compound is preferably reflective and radation-opaque. The filling compound can also be used for light scattering.

According to at least one embodiment of the method, an upper side of the islands facing away from the growth substrate is, prior to step C), conical or pyramid-shaped. Preferably, only the upper side is formed in this manner and lateral surfaces of the islands are oriented substantially perpendicular to the growth substrate. In that case, the upper side has a smaller inclination, different from the lateral surfaces of the islands.

According to at least one embodiment, the upper side protrudes beyond the filling compound. The islands then partially protrude from the filling compound.

According to at least one embodiment, the upper side of the islands protrudes into an electrical contact layer. This contact layer is formed for example as an n-type contact. The contact layer can be formed as a reflective layer or a reflective layer stack. Alternatively, the contact layer can also be formed from a radiolucent material.

According to at least one embodiment, the carrier substrate is attached to the islands via the electrical contact layer. In other words, in that case, the electrical contact layer is located between the carrier substrate and the islands and provides mechanical adhesion between the islands and the carrier substrate. The contact layer can be formed by a layer stack formed by several, preferably metallic, layers.

According to at least one embodiment, the electrical contact layer is applied to the semiconductor layer sequence over the whole area for contacting for the p-type layer. This step is preferably performed after steps A) and B) and prior to step C).

According to at least one embodiment, the electrical contact layer for contacting the p-type layer and/or the n-type layer is produced from a transparent, conductive oxide. This electrical contact is preferably integrally formed on the islands and surrounds the islands at least in places in a form-fitting manner. The electrical contact layer is preferably oriented in parallel with the growth substrate on a side of the islands facing the growth substrate and in regions between the islands, as viewed in a top view.

According to at least one embodiment, the electrical contact layer is subsequently removed from the upper sides of the islands, in particular prior to step C). Optionally, prior to step C), electrical insulation can be applied to the contact layer in places.

According to at least one embodiment, the electrical contact layer, in particular the electrical contact for contacting the p-type layer, is applied spaced apart from the separating layer. In particular, the electrical contact layer can be electrically insulated from the separating layer. According to at least one embodiment, the electrical contact layer, in particular the contact layer for contacting the p-type layer, is formed such that this layer does not extend as far as lower sides of the islands facing away from the carrier substrate. In other words, in that case the islands protrude beyond the electrical contact layer towards the growth substrate.

Furthermore, an optoelectronic semiconductor component is provided. The semiconductor component is produced by means of a method as described in conjunction with one or more of the embodiments stated above. Features of the method are thus also disclosed for the semiconductor component, and vice versa.

In at least one embodiment, the separating layer is located at least partly in the produced semiconductor component. The separating layer can have isolation tracks, for instance due to the laser radiation.

According to at least one embodiment, the separating layer is in direct contact with the islands, with the electrical contact layer for contacting the p-type layer of the semiconductor layer sequence and/or with the filling compound which is arranged between the adjacent islands.

According to at least one embodiment, individual islands or groups of islands can be electrically actuated independently of each other. In this way, the islands or the groups of islands can be used as pixels of a display, which can be preferably actively actuated.

Such an optoelectronic semiconductor component can be used for example as a light source in flexible displays. In such a light source, several semiconductor components can be grouped to form an arrangement having a larger surface, for instance via a so-called pick-and-place process.

A method described herein and an optoelectronic semiconductor component described herein will be explained in more detail hereinafter with reference to the drawing and with the aid of exemplified embodiments. Same reference numerals designate same elements in the individual figures. However, the illustration is not to scale rather individual elements may be illustrated excessively large for ease of understanding.

BRIEF DESCRIPTION OF THE DRAWINGS

In the drawings:

FIGS. 1 to 8 and 13 show schematic sectional illustrations of method steps of a method described herein for producing optoelectronic semiconductor components described herein, and FIGS. 9 to 12 show schematic illustrations of exemplified embodiments of optoelectronic semiconductor components described herein.

DETAILED DESCRIPTION

Figure 1:
Figure 1:
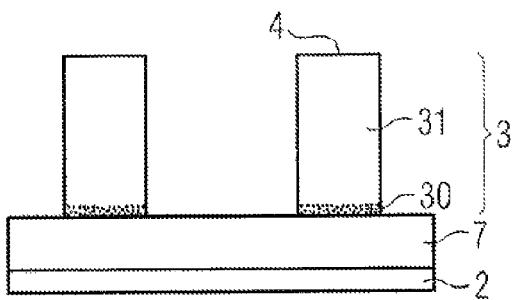
Figure 1:
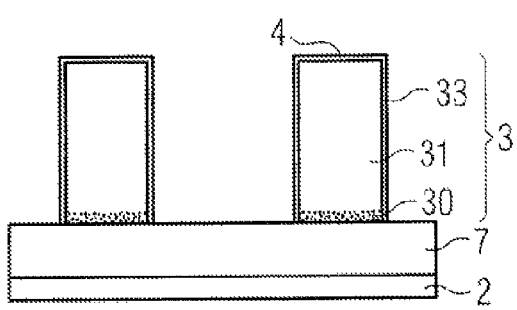
Figure 1:
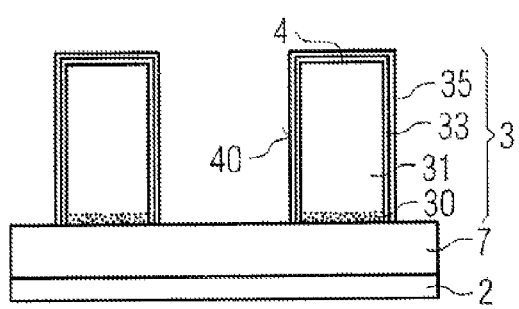
Figure 1:
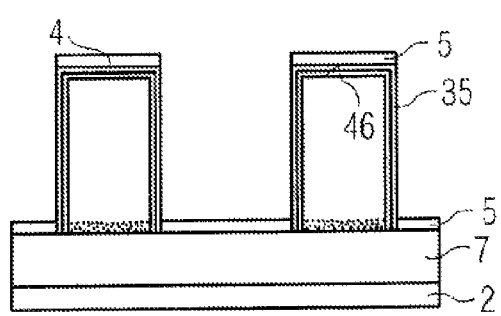
Figure 1:
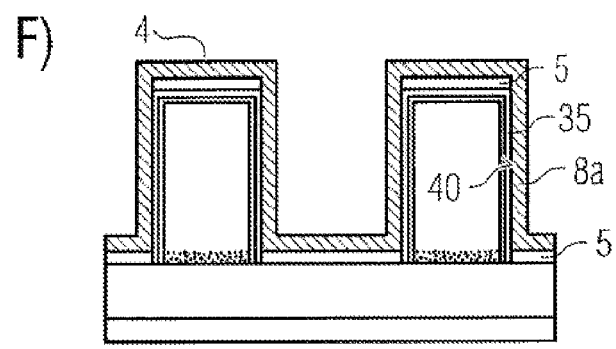
Figure 1:
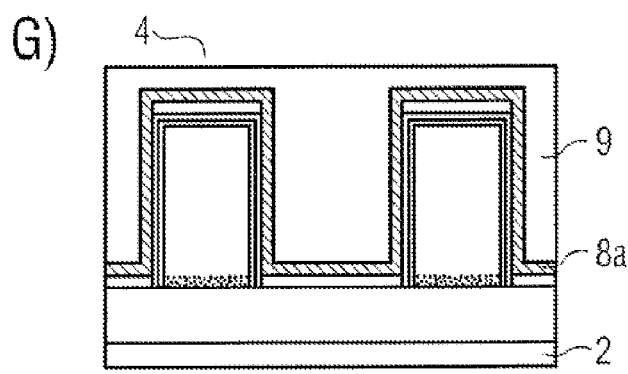
Figure 1:
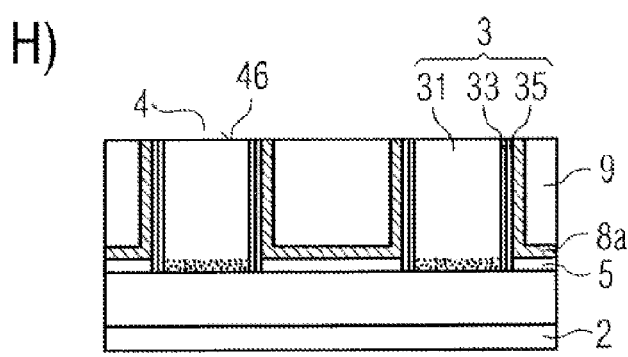
Figure 1:
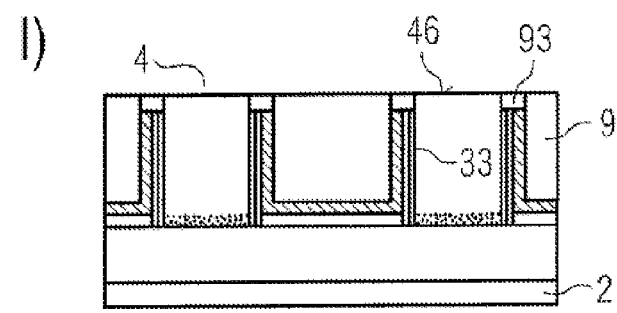
Figure 1:
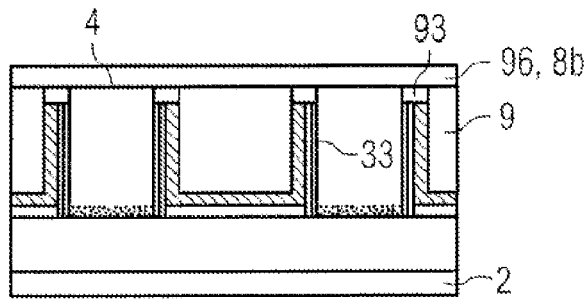
Figure 1:
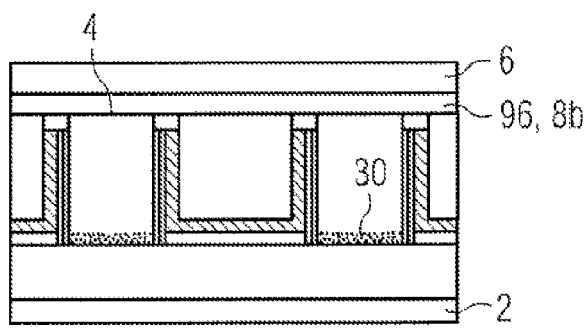
Figure 1:
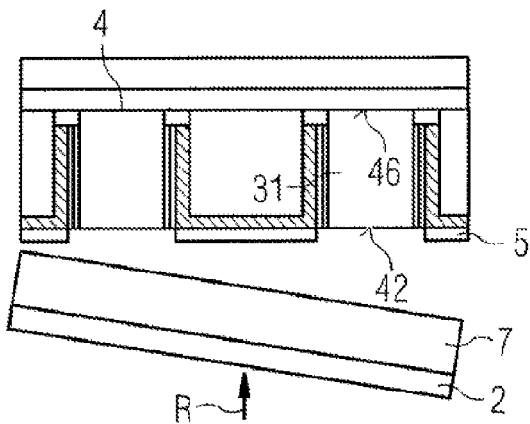
Figure 1:
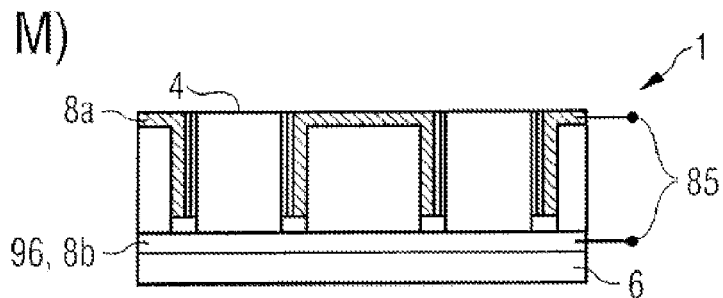

FIG. 1 shows schematic sectional illustrations of a method for producing an optoelectronic semiconductor component 1. According to FIG. 1A, a buffer layer 7, for instance formed from undoped GaN, is deposited on a growth substrate 2, e.g. a sapphire substrate or a silicon substrate.

FIG. 1B shows that islands 4 are deposited on the buffer layer 7, for instance by self-organised, three-dimensional growth. The islands 4 preferably comprise a sacrificial layer 30 formed from an absorbing material, and an n-type layer 31 which is formed for example in the form of a hexagonal prism. The sacrificial layer 30 and the n-type layer 31 are preferably formed from the same material system, for instance from AlInGaN, in particular from GaN. The n-type layer 31 is n-doped and is a core of the islands 4.

An active zone 33 is epitaxially deposited on the n-type layer 31, see FIG. 1C. The active zone 33 is based for example on InGaN. The active zone 33 surrounds the n-type layer 31 and the sacrificial layer 30 preferably all around, on a peripheral surface 40 and also on an upper side 46 facing away from the growth substrate 2.

According to FIG. 1D, a p-type layer 35 is deposited on the active zone 33. The p-type layer 35 is p-doped and is preferably based on GaN or on AlGaN.

In the method step shown in FIG. 1E, a separating layer 5 is deposited on the grown islands 4 and on the buffer layer 7 over the whole area. The separating layer 5 is preferably formed of a material which has a smaller bandgap than the buffer layer 7 and the layers 31, 35. Alternatively or in addition, the material of the separating layer 5 is a material which can be etched selectively with respect to the materials of the islands 4 and of the buffer layer 7, which has a coefficient of thermal expansion different from that of the materials of the islands 4 and of the buffer layer 7, or which can be easily detached from the materials of the islands 4 and of the buffer layer 7. For example, these coefficients of thermal expansion differ from each other by at least a factor of 2 or 4 or 6 or 10.

According to the method step illustrated in FIG. 1F, a transparent, electrical contact layer 8a is deposited on the separating layer 5. The contact layer 8a is formed, for example, of indium tin oxide, ITO for short, and is a p-type contact. The contact layer 8a is deposited directly on the p-type layer 35 on the peripheral surfaces 40.

In the method step shown in FIG. 1G, a filling compound 9 is applied to the islands 4 and preferably also completely fills intermediate spaces between the islands 4. The filling compound 9 is formed, for example, from an electrically insulating material such as silicon dioxide.

According to FIG. 1H, the filling 9, the contact layer 8a and the semiconductor layer sequence 3 are partially removed so that the n-type layer 31 is exposed and the upper side 46 of the islands 4 facing away from the growth substrate 2 is produced. The side facing away from the growth substrate 2 and formed from the filling 9 and the islands 4 is, in the method step according to FIG. 1H, preferably planar and flat.

FIG. 1I shows that a passivation 93 is applied to the active zone 33. A transition between the p-type layer 35 and the n-type layer 31 can be protected against electrical short-circuits by the passivation 93. Such a passivation 93 can be produced, for example, by a deactivation, in places, of the p-type layer 35, in particular by a targeted destruction of the p-type conductive properties, e.g. by means of hydrogen plasma.

Then, a further electrical contact layer 8b is applied, see FIG. 1J. The contact layer 8b can also act as a mirror 96 and in this respect comprise, for example, a silver layer. In contrast to the illustration, the electrical contact layer 8b can be formed by a layer stack formed by several, mutually different and in particular metallic layers.

As shown in FIG. 1K, a carrier substrate 6 is applied to the electrical contact layer 8b, e.g. by means of adhesion or soldering.

Then, see FIG. 1L, a laser radiation R is used to remove the growth substrate 2 including the buffer layer 7 from the islands 4 and the filling 9 connecting the islands 4. The laser radiation R is focussed on the separating layer 5 and on the sacrificial layer 30. The sacrificial layer 30 and the separating layer 5 are partially destroyed and/or melted by the laser radiation R. The growth substrate 2 is preferably removed with the support of mechanical force effect.

As an alternative to the laser removal method, the separating layer and/or the sacrificial layer can be removed by means of a selective etching process and/or by bracing which is produced owing to a difference in the coefficients of thermal expansion of the separating layer 5 and of the buffer layer 7. The separation of the growth substrate can likewise be supported by means of mechanical force effect, e.g. by ultrasound.

FIG. 1M illustrates the produced semiconductor component 1. For external, electrical contacting, electrical contact points 85 are attached. An electrical contacting of the n-type layer thus occurs via the electrical contact layer 8b which can be formed as a mirror 96 and via the preferably transparent and radiolucent contact layer 8a which is integrally formed on the islands 4 and surrounds the islands 4 all around, as viewed in a top view of the carrier substrate 6. Alternatively, the electrical contact layer 8b and the carrier substrate 6 can likewise be radiolucent.

As in all the other exemplified embodiments, structuring or roughening can also optionally be formed on the islands 4 and/or on the filling 9, for instance to improve light coupling-out efficiency. For this purpose, the n-type layer 31 can be partially removed.

Figure 2:
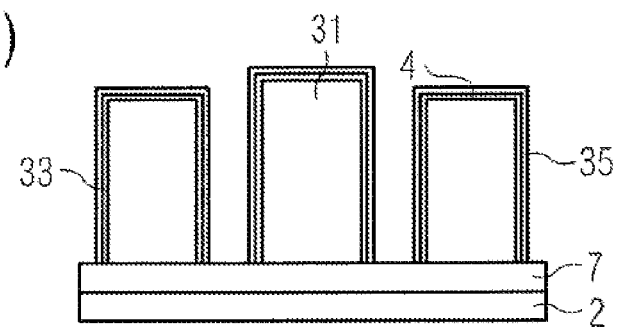
Figure 2:
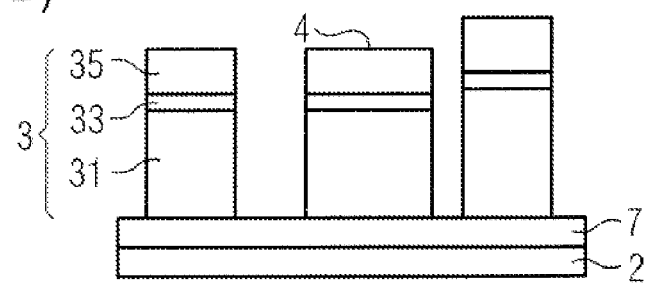
Figure 2:
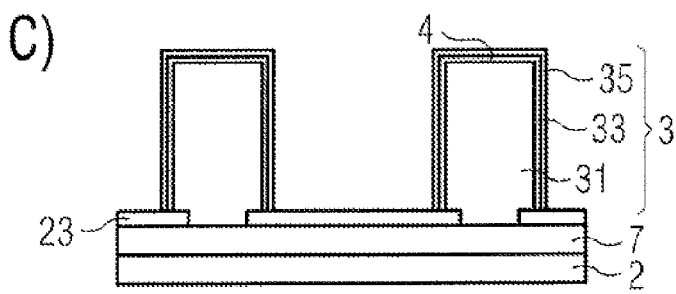
Figure 2:
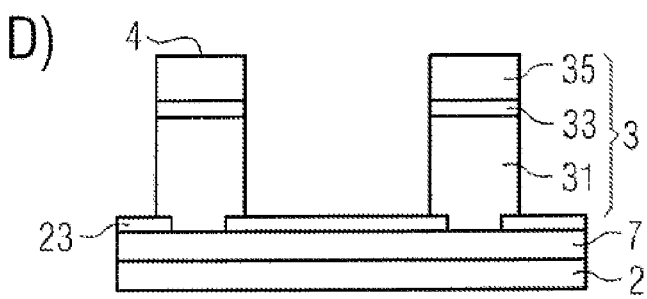
Figure 2:
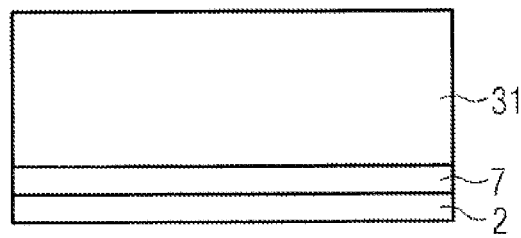
Figure 2:
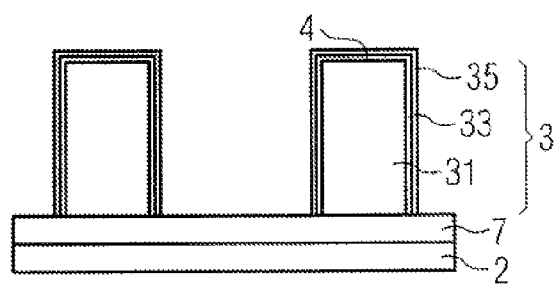
Figure 3:
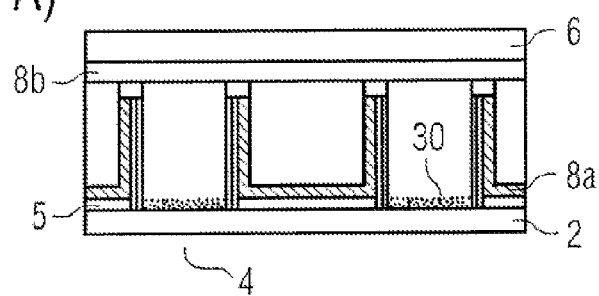
Figure 3:
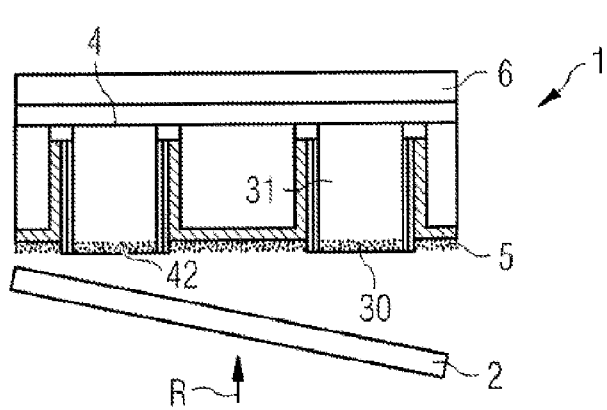

In conjunction with FIG. 2, different options for producing the islands 4 are schematically illustrated. According to FIG. 2A, the islands 4 are grown on the growth substrate 2 in a self-organised manner, wherein the buffer layer 7 is optional. The individual islands 4 can have mutually different heights and/or diameters. The active zone 33 of the respective islands 4 can have a constant material composition and constant thickness, within manufacturing tolerances so that the different islands 4 have a substantially identical spectral directional characteristic. Such islands 4, as illustrated in FIG. 2A, can also be seen in FIG. 1. Alternatively, a varying content of e.g. indium can be present over the active zone 33 so that a spectral broadband emission is possible.

It is further possible for the islands 4 to be grown in a self-organised manner, wherein the n-type layer 31, the active zone 33 and the p-type layer 35 of the semiconductor layer sequence 3 follow each other in the direction away from the growth substrate 2, see FIG. 2B. The active zone 33 can thus be oriented substantially in parallel with the growth substrate 2. If inclined facets, e.g. pyramid-shaped facets, are formed on a side of the n-type layer 31 facing away from the growth substrate 2, then the active zone 33 can replicate a shape of these facets and be formed for example like a pyramid jacket.

Islands 4 formed corresponding to FIGS. 2A and 2B can also be seen in FIGS. 2C and 2D. According to FIGS. 2C and 2D, a masking layer 23 is applied in each case on the growth substrate 2 or on the optional buffer layer 7. The islands 4 grow out of openings in the masking layer 23. It is possible for the islands 4 to at least partially cover the masking layer 23 in each case, as viewed in a top view of the growth substrate 2.

A further option for producing the islands 4 is shown in conjunction with FIGS. 2E and 2F. According to FIG. 2E, a continuous, n-type layer 31 is produced on the growth substrate 2 or on the buffer layer 7. This n-type layer 31 is then structured, for example by means of etching. Then, the active zone 33 and the p-type layer 35 are grown on the resulting structures, see FIG. 2F.

The further method steps can each be performed as shown in conjunction with FIG. 1.

As in all the other exemplified embodiments, the islands 4 can each be applied to the growth substrate 2 in a regular or irregular manner. The completed semiconductor component 1 has in each case, for example, at least 100 or at least 1000 or at least 10,000 islands 4. A degree of coverage of the growth substrate 2 by the islands 4, also referred to as surface factor, amounts, as viewed in a top view, preferably to at least 5% or at least 25% or at least 50%. Alternatively or in addition, the surface factor amounts at the most to 90% or at the most to 80% or at the most to 75%. A surface of the active zone 33, in the direction perpendicular to the n-type layer 31 and to the p-type layer 35, is, in particular in embodiments according to FIGS. 2A, 2C and 2F, preferably greater than a surface of the growth substrate 2. The surface factor can thus be greater than 1, e.g. at least 1.5 or at least 3 or at least 5.

FIGS. 3 to 7 each show sectional illustrations of variants of the design of the separating layer 5. Corresponding separating layers 5 can also be used in methods as shown in conjunction with FIGS. 1 and 2.

According to FIG. 3A, the separating layer 5 is located directly on the growth substrate 2. When separating the islands 4 from the growth substrate 2, preferably only the separating layer 5 and the optional sacrificial layer 30 is destroyed and the growth substrate 2 remains undamaged. The growth substrate 2 is hereby reusable.

According to FIG. 4A, the separating layer 5 is formed simultaneously as masking layer 23 and is located partially between the buffer layer 7 and the n-type layer 31. As can be seen in FIG. 4B, the buffer layer 7 and the growth substrate 2 are removed. The masking layer 23 is accordingly at least partially destroyed by the laser radiation R.

According to FIG. 5A, the separating layer 5 is applied to a side of the masking layer 23 facing away from the growth substrate 2. It is hereby possible, see FIG. 5B, for the masking layer 23 to remain substantially uninfluenced by the laser radiation R on the growth substrate 2. Therefore, the growth substrate 2 together with the masking layer 23 is reusable, e.g. after cleaning It is possible for the at least partially destroyed, optional sacrificial layer 30 or, as a contrast to the illustration, the n-type layer 31 to copy the openings in the masking layer 23.

Figure 4:
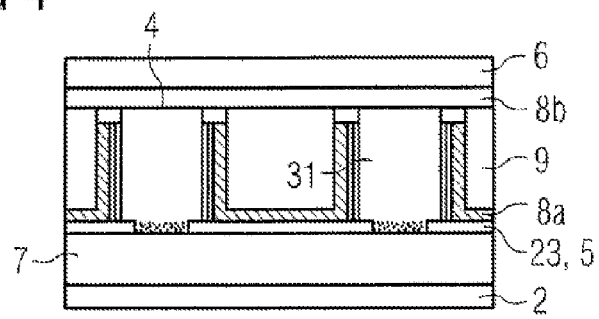
Figure 4:
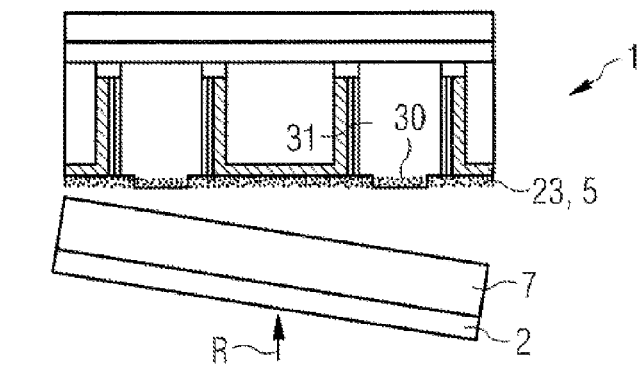

According to FIGS. 6A and 6B, as a contrast to the illustration in FIG. 4, the separating layer 5 used as a marking layer 23, is attached directly to the growth substrate 2.

Figure 5:
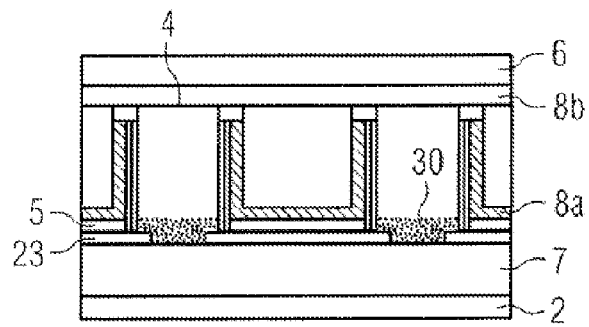
Figure 5:
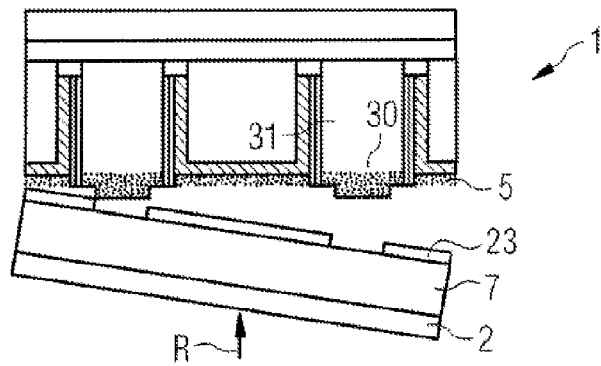
Figure 6:
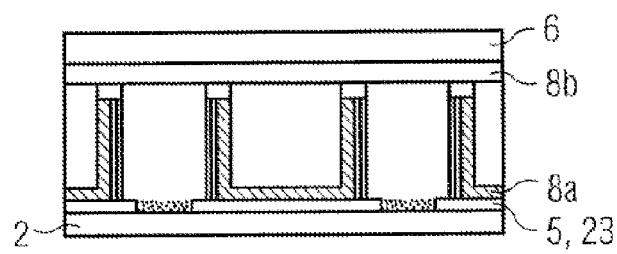
Figure 6:
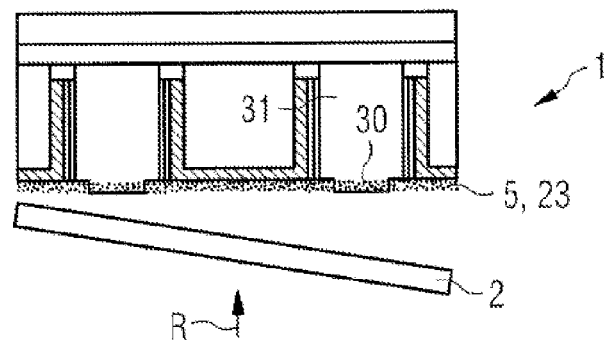
Figure 7:
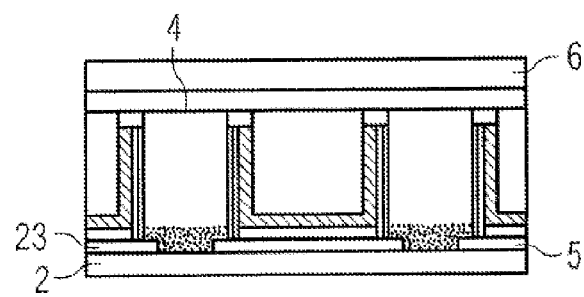
Figure 7:
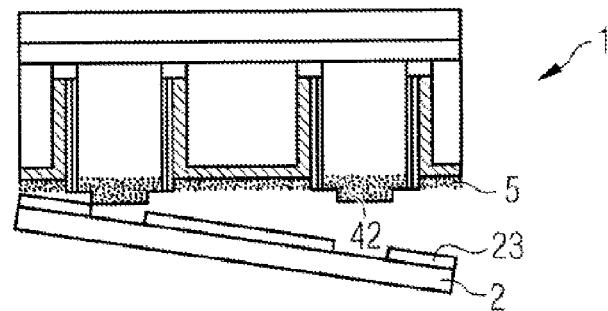

In FIG. 7, the masking layer 23, to which the separating layer 5 is attached, is located directly on the growth substrate 2, as a contrast to the illustration in conjunction with FIG. 5.

Figure 8:
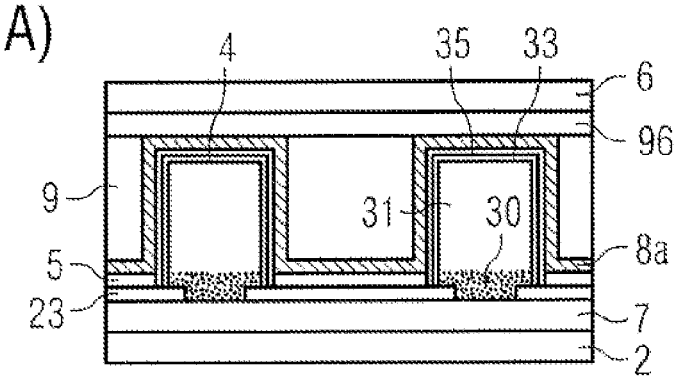
Figure 8:
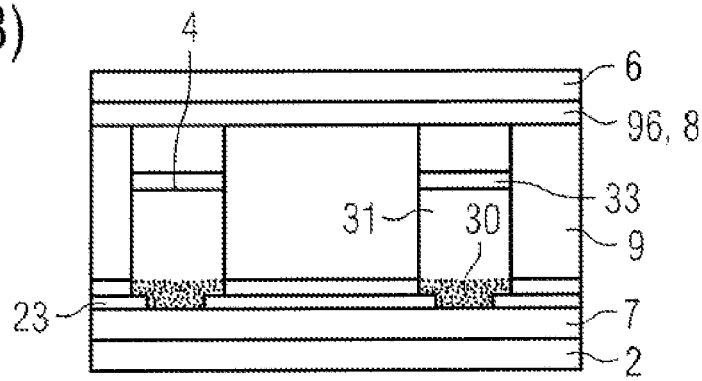
Figure 8:
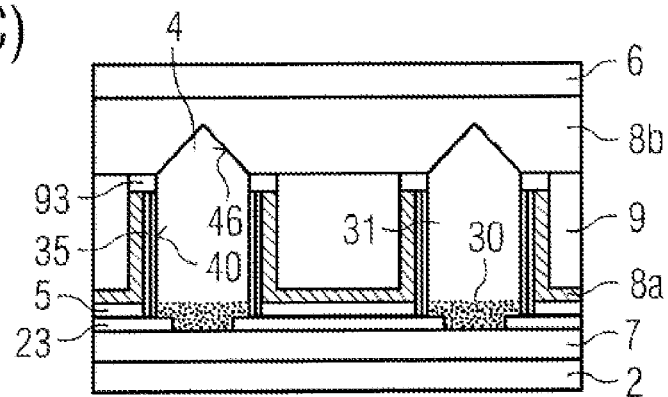
Figure 8:
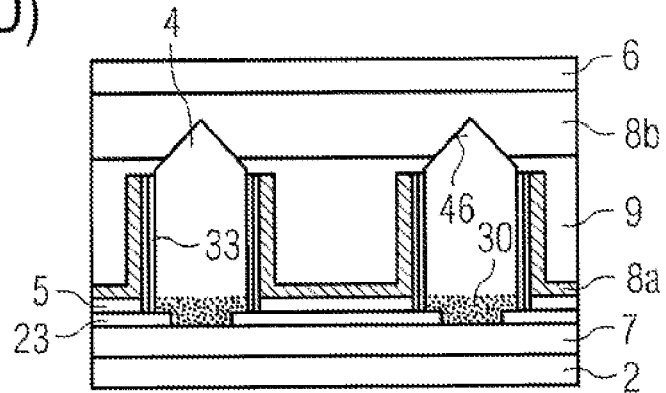
Figure 8:
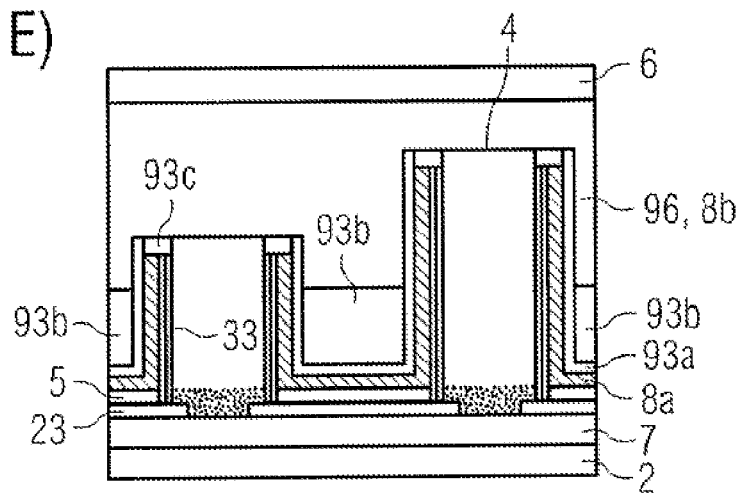

FIG. 8 shows schematic sectional illustrations of further options of contacting the islands 4, in each case prior to the detachment of the growth substrate 2. The separating layer 5, the masking layer 23 and the buffer layer 7 can each be configured as described in conjunction with FIGS. 1 to 7.

According to FIG. 8A, the p-type contacting occurs via the layer 8a by means of the mirror 96 on the side facing the carrier substrate 6. N-type contacting occurs via the side facing the growth substrate 2. The side of the p-type layer 35, facing away from the growth substrate 2, and the active zone 33 are not removed according to FIG. 8A. The growth substrate 2 is preferably replaced by electrically conductive structures, not shown in FIG. 8A. The same applies for FIG. 8B.

According to FIGS. 8C and 8D, the upper side 46 of the n-type layer 31 is formed to a point and shaped into a pyramid e.g. by wet-chemical etching. The passivation 93 is located at a boundary between the upper side 46 and at the peripheral surfaces 40. The filling 9 terminates substantially flush with the passivation 93 and does not extend, or only extends slightly, to the upper side 46. The n-type layer 31 is hereby electrically contacted by the electrical contact layer 8b on the carrier substrate 6. The p-type layer 35 is formed via the radiolucent electrical contact layer 8a which is integrally formed on the islands 4.

According to FIG. 8D, a separate passivation 93 is not formed, but rather a transition between the layers 31, 35 and the active zone 33 are covered by the filling 9 in the direction away from the growth substrate 2. The filling 9 thus partly covers the upper sides 46 of the n-type layer 31 and is introduced after the production of the upper sides 46. In contrast, according to FIG. 8C, the filling 9 can be introduced prior to the production of the upper sides 46. The filling 9 can be applied in a single process step. Alternatively, the filling 9 can also be applied in several process steps, optionally interrupted by other process steps.

FIG. 8E illustrates that the individual islands 4 can have different heights. Planarisation preferably occurs by way of the electrical contact layer 8b which can be configured as a mirror 96. The electrical contact layer 8a for p-type contacting is preferably covered in a form-fitting manner by a thin passivation 93a which copies a shape of the electrical contact layer 8a. Optionally, a further passivation 93b is located at least in partial regions between the islands 4, wherein the electrical contact layer 8b for n-type contacting then follows said passivation in the direction away from the growth substrate 2.

Figure 9:
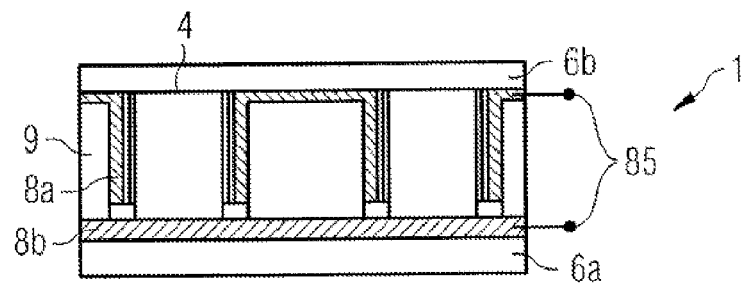
Figure 9:
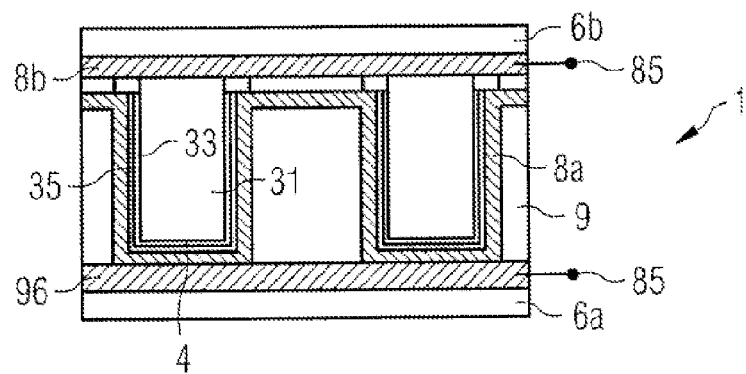
Figure 9:
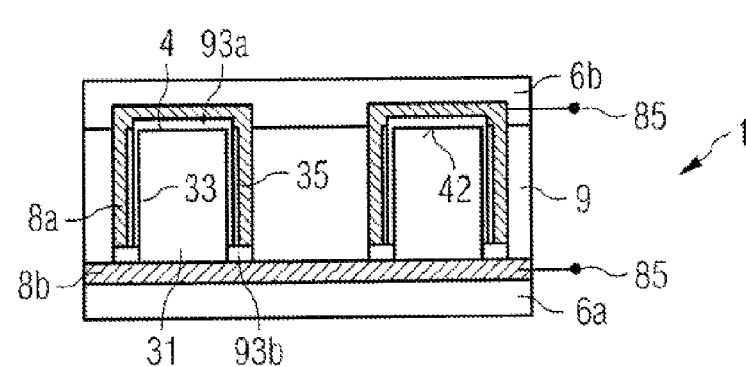
Figure 9:
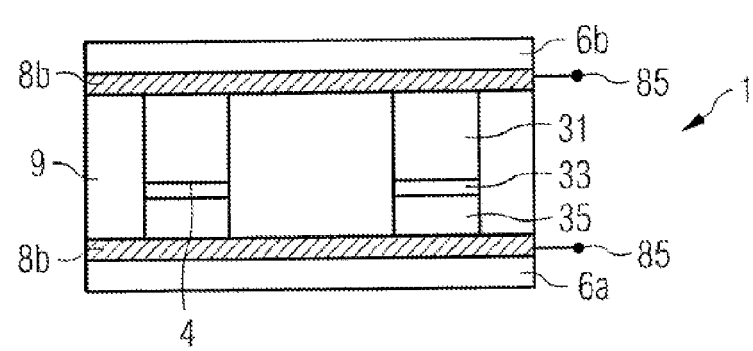

The sectional illustrations of FIG. 9 show exemplified embodiments of the semiconductor component 1 which have an in particular mechanically flexible carrier substrate 6. The figures are illustrated rotated by 180° with respect to a growth direction of the semiconductor layer sequence 3 compared with FIGS. 1 to 8.

The carrier substrate 6a, via which the n-type contacting with the contact layer 8b occurs, is a flexible substrate, e.g. a film based on a metal or a plastic. The contact layer 8b is optionally configured as a mirror, as in all the other exemplified embodiments.

A second, mechanically flexible carrier substrate 6b is optionally attached to a side of the islands 4 facing away from the carrier substrate 6a. The further carrier substrate 6b is preferably radiolucent.

According to FIG. 9B, the n-type layer 31 is contacted via the contact layer 8b and the further carrier substrate 6b. A corresponding contacting can be used for semiconductor components as shown in conjunction with FIG. 8A. The contact layers 8a, 8b are each connected to electrical contact points 85 for an electrical, external contacting of the semiconductor component 1.

According to FIG. 9C, the p-type contacting occurs via the contact layer 8a which is integrally formed on the islands 4. In the direction away from the carrier substrate 6a, the n-type layer 31 is followed by a passivation 93a which is attached to the former lower sides 42 facing the growth substrate.

The electrical contact layer 8a which can be composed of a layer formed prior to the removal of the growth substrate and of a layer formed after the removal of the growth substrate optionally protrudes into the further carrier 6b according to FIG. 9C. The further carrier 6b can be applied to the filler 9 and to the islands 4 as a coating. As a contrast to the illustration, the side of the carrier 6b facing the islands 4 may be flat.

FIG. 9D illustrates an electrical contacting for the islands 4, as shown in conjunction with FIG. 8b.

Figure 10:
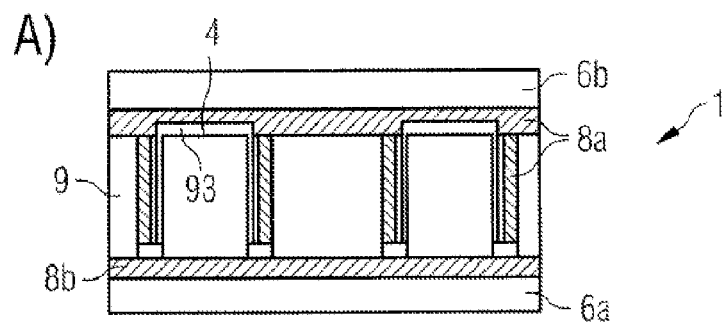
Figure 10:
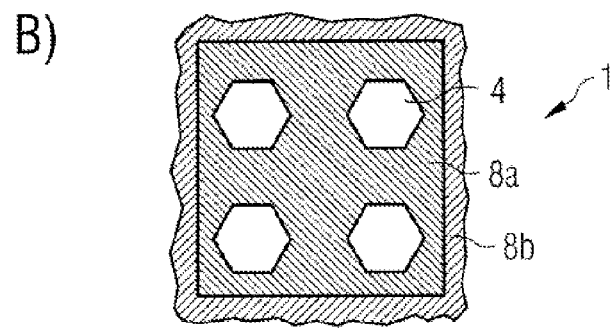
Figure 11:
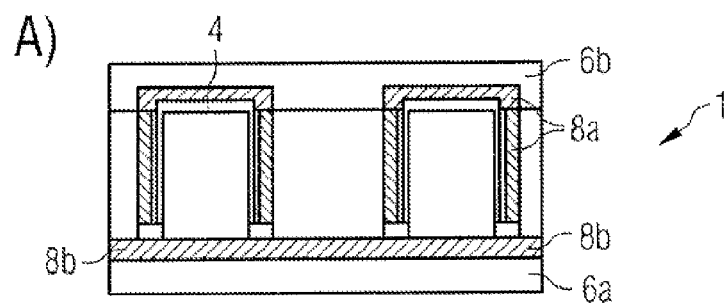
Figure 11:
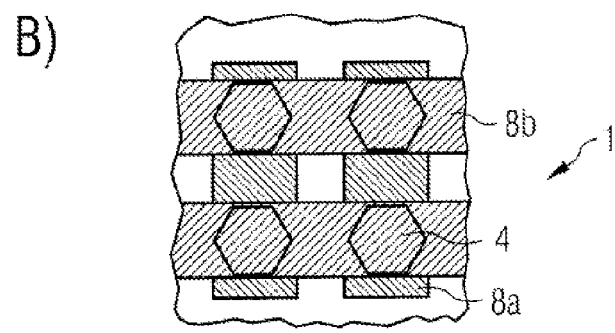
Figure 12:
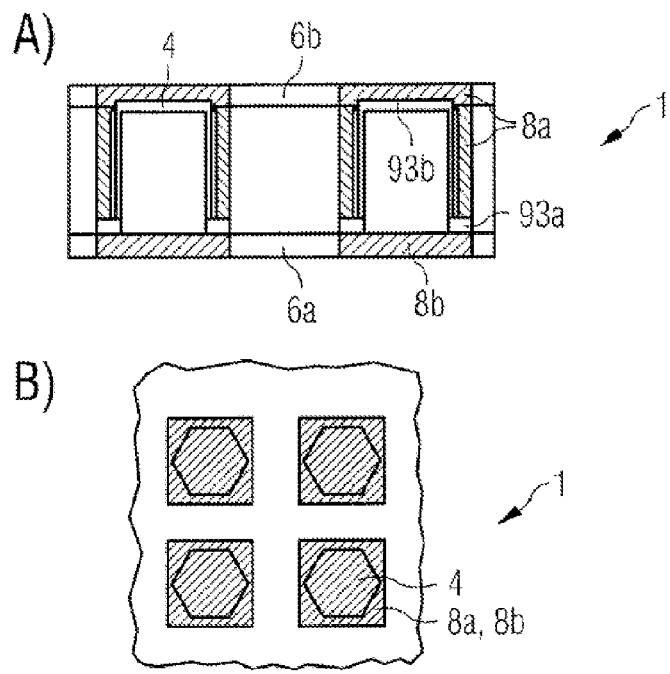

FIGS. 10 to 12 show sectional illustrations—in the case of the figures marked 'A'—and schematic top views—in the case of the figures marked 'B'—of the optoelectronic semiconductor component 1. In each case, the electrical contacting is designed as explained in conjunction with FIG. 9C. However, all the other illustrated types of contacting and designs of the contact layers 8a, 8b can be used in conjunction with FIGS. 10 to 12.

According to FIG. 10, the contacting layers 8a, 8b are each continuous layers. All the islands 4 are thus connected electrically in parallel and can be electrically actuated together.

FIG. 11 illustrates that the electrical contact layers 8a, 8b are located on mutually opposite sides of the islands 4 and are each configured in a strip-like manner, wherein the strips are oriented orthogonal to one another. In this manner, the individual islands 4 can be electrically actuated individually. Each of the adjacent path-like contact layers 8a, 8b contacts a row or a column of the islands 4, see FIG. 11B. In a deviation therefrom, it is possible for the individual paths to contact several rows and columns of the islands 4 together.

FIG. 12 illustrates that the contact layers 8a, 8b are each restricted to individual islands 4. In this manner, a customised interconnection of the islands 4, e.g. on an external mounting structure, not shown, is possible. As a contrast to the illustration, several islands 4 can be covered by contiguous contact layers 8a, 8b, which means that groups of islands 4 can be electrically switched together. Conductor paths, not shown, can be attached between the contact layers 8a, 8b located directly on the islands 4 in order to form a more complex interconnection of the islands 4.

Figure 13:
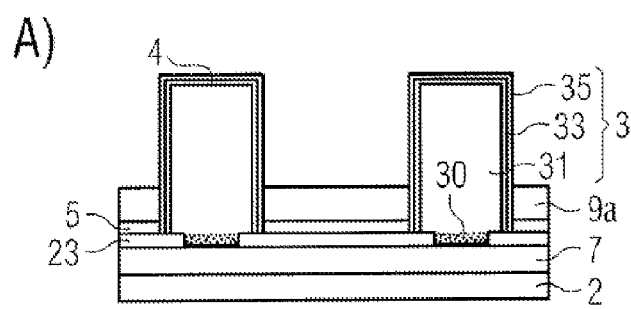
Figure 13:
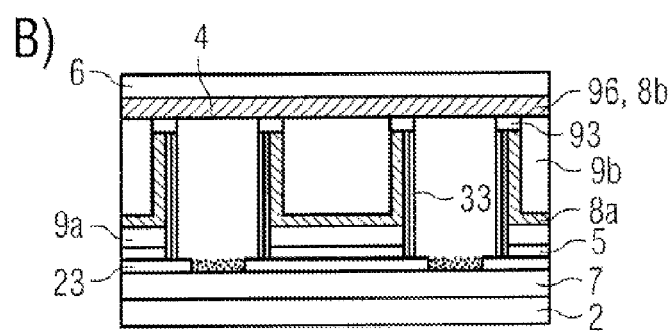

The sectional illustrations according to FIGS. 13A and 13B show that the p-type contact layer 8a is arranged spaced apart from the separating layer 5. A first filler 9a is located between the separating layer 5 and the contact layer 8a. The contact layer 8a is thus embedded in the fillers 9a, 9b together with the passivation 93. It is hereby possible for only one part of the active zone 33 to be supplied with current.

The invention described herein is not limited by the description using the exemplified embodiments. Rather, the invention includes any new feature and any combination of features, included in particular in any combination of features in the claims, even if this feature or this combination itself is not explicitly stated in the claims or exemplified embodiments.

This patent application claims the priority of German patent application 10 2012 109 594.9, the disclosure content of which is hereby incorporated by reference.

The invention claimed is:

1. A method for producing an optoelectronic semiconductor component comprising the steps of:
   A) producing radiation-active islands having a semiconductor layer sequence on a growth substrate, wherein the islands each comprise at least one active zone of the semiconductor layer sequence, and an average diameter of the islands, as viewed in a top view of the growth substrate, amounts to between 50 nm and 10 μm inclusive,
   B) producing at least one separating layer on a side of the islands facing the growth substrate, wherein the separating layer surrounds the islands all around, as viewed in a top view of the growth substrate,
   C) attaching a carrier substrate to a side of the islands facing away from the growth substrate, and
   D) detaching the growth substrate from the islands, wherein at least a part of the separating layer is destroyed and/or at least temporarily softened during the detachment,
      wherein after steps A) and B) and prior to step C) an electrical contact layer for contacting a p-type layer of the semiconductor layer sequence is applied over the whole area of the p-type layer,
      wherein the electrical contact layer is produced from a transparent, conductive oxide and is integrally formed on the islands, and
      wherein the electrical contact layer is removed from upper sides of the islands.

2. The method according to claim 1, wherein in step D) the detaching is performed by means of laser radiation so that at least a part of the separating layer is destroyed and/or at least temporarily softened by the laser radiation.

3. The method according to claim 1, wherein the islands comprise a sacrificial layer on a side facing the growth substrate, wherein the sacrificial layer is a part of the semiconductor layer sequence and acts in an absorbing manner for laser radiation.

4. The method according to claim 1, wherein step A) follows step B) and precedes step C).

5. The method according to claim 1, wherein a region between adjacent islands is filled with an electrically insulating filling compound and the carrier substrate is applied to a side of the islands facing away from the growth substrate, wherein the filling compound and the carrier substrate are mechanically flexible.

6. The method according to claim 1, wherein a buffer layer is produced on the growth substrate, wherein the buffer layer is a continuous layer which is unstructured as viewed in a top view, wherein the separating layer is produced on a side of the buffer layer facing away from the growth substrate, wherein the buffer layer is completely removed at the latest in step D) so that adjacent islands are no longer connected together via a semiconductor material of the semiconductor layer sequence or of the buffer layer, and wherein in step D) the detaching is performed by means of laser radiation and at least a part of the separating layer is destroyed and/or at least temporarily softened by the laser radiation.

7. The method according to claim 6, wherein the separating layer is a masking layer having a multiplicity of openings, wherein the islands grow out of these openings.

8. The method according to claim 7, wherein the separating layer is located directly on the growth substrate or directly on a side of the buffer layer facing away from the growth substrate.

9. The method according to claim 1, wherein step B) follows step A) and precedes step C).

10. The method according to claim 9, wherein prior to step C) the separating layer is covered—as viewed in a top view—at least in places by an electrical contact layer which is configured for supplying the islands with current, wherein the electrical contact layer touches the separating layer.

11. The method according to claim 1, wherein the active zone surrounds an n-type layer of the islands all around at least on a peripheral surface, as viewed in a top view.

12. The method according to claim 1, wherein the islands are grown as columns, wherein a quotient of an average height of the islands and an average diameter of the islands amounts to between 1 and 100 inclusive.

13. The method according claim 1, wherein a region between adjacent islands is filled with an electrically insulating filling compound, wherein an upper side of the upper sides of the islands facing away from the growth substrate is, prior to step C), conical or pyramid-shaped, wherein the upper side protrudes beyond the filling compound and protrudes into an electrical contact layer, and wherein the carrier substrate is attached to the islands via the electrical contact layer.

14. The method according to claim 13, wherein the filling compound and the carrier substrate are mechanically flexible.

15. An optoelectronic semiconductor component,
which is produced by means of a method according to claim 1,
wherein the separating layer is located at least partly directly on the islands and/or on an electrical contact layer for contacting a p-type layer of the semiconductor layer sequence and/or on a filling compound which is arranged between adjacent islands.

16. The optoelectronic semiconductor component according to claim 15, which is configured for a display,
wherein individual islands or groups of islands can be electrically actuated independently of each other so that pixels of the display are formed by the islands or groups of islands.

17. The optoelectronic semiconductor component according to claim 15,
wherein a region between adjacent islands is filled with an electrically insulating filling compound which is mechanically flexible, and
wherein the carrier substrate is formed as a mechanically flexible carrier substrate.

\* \* \* \* \*